United States Patent
Hatanaka et al.

(10) Patent No.: US 9,008,810 B2
(45) Date of Patent: Apr. 14, 2015

(54) CODING APPARATUS AND METHOD, DECODING APPARATUS AND METHOD, AND PROGRAM STORAGE MEDIUM

(75) Inventors: Mitsuyuki Hatanaka, Kanagawa (JP); Mitsuru Tanabe, Kanagawa (JP)

(73) Assignee: Sony Corporation, Tokyo (JP)

( * ) Notice: Subject to any disclaimer, the term of this patent is extended or adjusted under 35 U.S.C. 154(b) by 769 days.

(21) Appl. No.: 12/715,107

(22) Filed: Mar. 1, 2010

(65) Prior Publication Data

US 2010/0161342 A1 Jun. 24, 2010

Related U.S. Application Data

(63) Continuation of application No. 11/389,242, filed on Mar. 27, 2006, now Pat. No. 7,702,406, which is a continuation of application No. 11/081,655, filed on Mar. 17, 2005, now Pat. No. 7,043,314, which is a continuation of application No. 09/734,390, filed on Dec. 11, 2000, now Pat. No. 6,965,805.

(30) Foreign Application Priority Data

Dec. 20, 1999 (JP) .................................. 11-360320

(51) Int. Cl.
| | |
|---|---|
| *G06F 17/00* | (2006.01) |
| *G10L 19/00* | (2013.01) |
| *G11B 20/10* | (2006.01) |
| *H03M 7/30* | (2006.01) |
| *G11B 20/00* | (2006.01) |

(52) U.S. Cl.
CPC ...... *G10L 19/0019* (2013.01); *G11B 20/10527* (2013.01); *G11B 2020/00043* (2013.01); *G11B 2020/10546* (2013.01); *H03M 7/30* (2013.01)

(58) Field of Classification Search
USPC ...................................... 700/94; 704/500–504
See application file for complete search history.

(56) References Cited

U.S. PATENT DOCUMENTS

| | | | | |
|---|---|---|---|---|
| 4,530,073 A | * | 7/1985 | Higashihara et al. | ...... 369/47.42 |
| 5,485,443 A | | 1/1996 | Niwayama | |
| 5,515,352 A | | 5/1996 | Iizuka | |
| 5,544,139 A | * | 8/1996 | Aramaki et al. | ........... 369/53.22 |

(Continued)

FOREIGN PATENT DOCUMENTS

| | | |
|---|---|---|
| JP | 08-287612 | 11/1996 |
| JP | 2000-132194 | 5/2000 |
| JP | 2000-175285 | 6/2000 |

OTHER PUBLICATIONS

"Exact Audio Copy", Nov. 27, 1999, archive.org, http://web.archive.org/web/19991127123753/http://www.exactaudiocopy.de/ , pp. 1-3.*

(Continued)

*Primary Examiner* — Davetta W Goins
*Assistant Examiner* — Daniel Sellers
(74) *Attorney, Agent, or Firm* — Oblon, McClelland, Maier & Neustadt, L.L.P.

(57) ABSTRACT

In order to obtain coded data which does not strike viewers and listeners as being incongruous, when plural audio data are to be coded, a coding program groups the respective audio data into one audio data, codes the grouped audio data in sequence with a predetermined number of samples being treated as units, and sets delimitations corresponding to the delimitations of the plural audio data in the coded data at coding units of the coded data.

21 Claims, 17 Drawing Sheets

(56) References Cited

U.S. PATENT DOCUMENTS

| | | | |
|---|---|---|---|
| 5,668,789 | A | 9/1997 | Yokota et al. |
| 5,969,763 | A * | 10/1999 | Sakamoto ............... 375/240.25 |
| 6,122,338 | A * | 9/2000 | Yamauchi ................... 375/377 |
| 6,198,707 | B1 | 3/2001 | Yamamoto |
| 6,256,348 | B1 | 7/2001 | Laczko et al. |
| 6,377,902 | B1 | 4/2002 | Eckert |
| 6,446,037 | B1 * | 9/2002 | Fielder et al. ................ 704/229 |
| 6,473,375 | B1 | 10/2002 | Aramaki |
| 6,584,273 | B1 * | 6/2003 | Ashley et al. ................ 386/281 |
| 6,597,961 | B1 | 7/2003 | Cooke |
| 6,807,450 | B1 * | 10/2004 | Takenaka et al. ............... 700/94 |
| 6,832,198 | B1 | 12/2004 | Nguyen et al. |
| 6,912,251 | B1 * | 6/2005 | Ward et al. ................... 375/240 |
| 6,931,370 | B1 * | 8/2005 | McDowell ................ 704/200.1 |
| 6,965,805 | B2 | 11/2005 | Hatanaka et al. |
| 2005/0204242 | A1 * | 9/2005 | Chou et al. ................... 714/741 |

OTHER PUBLICATIONS

"Exact Audio Copy, Whats New", Nov. 28, 1999, archive.org, http://web.archive.org/web/19991128065531/http://www.exactaudiocopy.de/eac9.html , pp. 1-12.*

"Exact Audio Copy, Extraction Technology", Nov. 27, 1999, archive.org, http://web.archive.org/web/19991127184942/http://www.exactaudiocopy.de/eac3.html , pp. 1-5.*

Summons to Attend Oral Proceedings issued Jun. 23, 2014 in European Application No. 00127701.1.

* cited by examiner

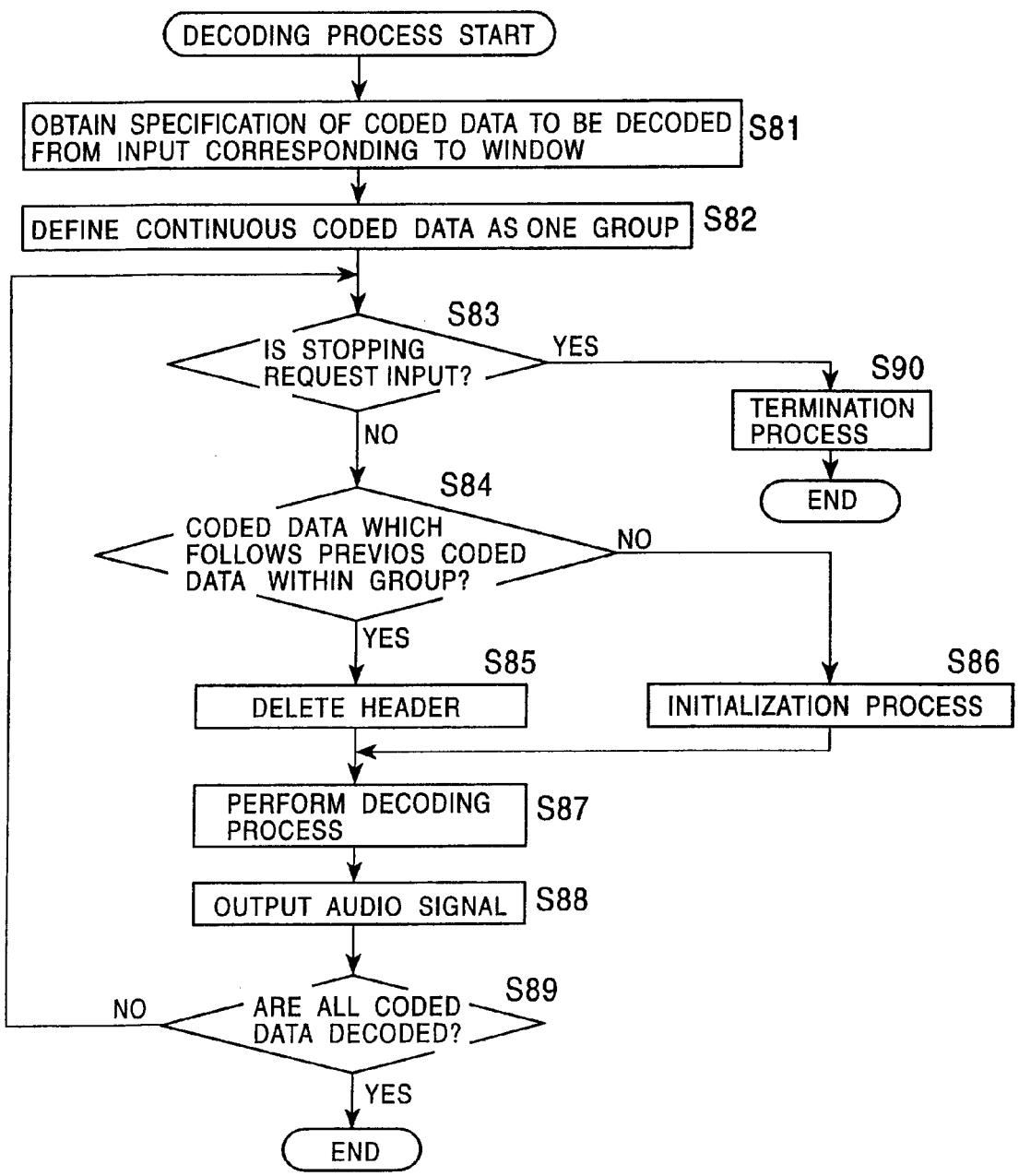

CODING APPARATUS AND METHOD, DECODING APPARATUS AND METHOD, AND PROGRAM STORAGE MEDIUM

This application is a continuation of U.S. application Ser. No. 11/389,242 filed on Mar. 27, 2006, the entire contents of which is incorporated herein by reference. U.S. application Ser. No. 11/389,242 is a continuation of U.S. application Ser. No. 11/081,655 filed on Mar. 17, 2005, which is a continuation of U.S. application Ser. No. 09/734,390 filed on Dec. 11, 2000, which claims the benefit under 35 U.S.C. §§119(a)-(d) to Japanese Patent Application No. 11-360320 filed on Dec. 20, 1999.

BACKGROUND OF THE INVENTION

1. Field of the Invention

The present invention relates to coding apparatuses and methods, decoding apparatuses and methods, and program storage media therefor. More particularly, the present invention relates to a coding apparatus and method for coding audio data, a decoding apparatus and method for decoding coded data, and a program storage medium therefor.

2. Description of the Related Art

As techniques for compressing and coding audio data, ATRAC (trademark), MPEG (Moving Picture Experts Group)-1 Audio Layer 3 (hereinafter referred to as an "MP3"), etc., have come to be widely used in personal computers, etc.

Referring to FIG. 1, a conventional audio coding process using ATRAC (Adaptive Transform Acoustic Coding) is described. For example, as shown in part (A) of FIG. 1, in a case where input sequential audio data is to be coded in such a manner as to correspond to plural sequential musical pieces, the sequential audio data (corresponding to the tracks in the figure) is divided into blocks for each audio data (that is, for each musical piece), as shown in part (B) of FIG. 1.

Each audio data, as shown in part (C) of FIG. 1, is divided into orthogonal transform blocks composed of, for example, 1024 samples.

The coding process is performed based on the orthogonal transform block. For example, as shown in FIG. 2, a sound unit (hereinafter referred to as an "SU") is created in such a manner as to correspond to an orthogonal transform block, and a coded stream (coded data) is formed. A header in which synchronization data, etc., is stored is added to the start of the coded stream.

When the position of the back end of the orthogonal transform block located at the end of each audio data does not match the track end position (the end position of the musical piece, that is, the end position of the audio data), as shown in part (D) of FIG. 1, data, which is "0", is stored in the portions (portions after the track end position, where there is no data) after the orthogonal transform block located at the end of each audio data.

Referring to the flowchart shown in FIG. 3, a conventional coding process by a personal computer is described. In step S11, the personal computer computes the number of necessary SUs on the basis of the number of samples (the number of samples of the original data which is not coded) of the current audio data.

In step S12, the personal computer performs a coding process for each orthogonal transform block. In step S13, the personal computer determines whether or not the data is the last orthogonal transform block. When it is determined that the data is not the last orthogonal transform block, the process returns to step S12, and the coding process is repeated.

When it is determined in step S13 that the data is the last orthogonal transform block, the process proceeds to step S14, whereby the personal computer determines whether or not the track end position is contained in the middle of the orthogonal transform block.

When it is determined in step S14 that the track end position is contained in the middle of the orthogonal transform block, the personal computer sets "0" in portions of the orthogonal transform block after the track end position, and the process proceeds to step S16.

When it is determined in step S14 that the track end position is not contained in the middle of the orthogonal transform block, the process of step S15 is not necessary. Therefore, step S15 is skipped, and the process proceeds to step S16.

In step S16, the personal computer codes the last orthogonal transform block. In step S17, the personal computer performs a termination process, such as closing a file in which coded data is stored.

In step S18, the personal computer determines whether or not there is next audio data. When it is determined that there is next audio data, the process returns to step S11, and coding of the next audio data is performed.

When it is determined in step S18 that there is no next audio data, the processing is terminated.

However, when the track end position is contained in the middle of the orthogonal transform block, data of "0" is placed at the end of the orthogonal transform block and coding is performed. As a result, in the coded-data obtained by being coded in this manner, as shown in FIG. 4, a no-audio interval occurs at the end of the musical piece.

In such coded data, for example, when plural musical pieces which are so-called "live-recorded", in which audio is not interrupted and is in sequence, are to be played back, audio is interrupted at the end of the musical piece, thereby striking viewers and listeners as being incongruous.

SUMMARY OF THE INVENTION

The present invention has been achieved in view of such circumstances. An object of the present invention is to make it possible to obtain coded data which does not strike viewers and listeners as being incongruous, or to make it possible to decode coded data without striking viewers and listeners as being incongruous.

The above and further objects, aspects and novel features of the invention will become more fully apparent from the following detailed description when read in conjunction with the accompanying drawings.

BRIEF DESCRIPTION OF THE DRAWINGS

FIG. 19 is a flowchart illustrating a decoding process by the decoding program 54G.

DESCRIPTION OF THE PREFERRED EMBODIMENT

Figure 1:
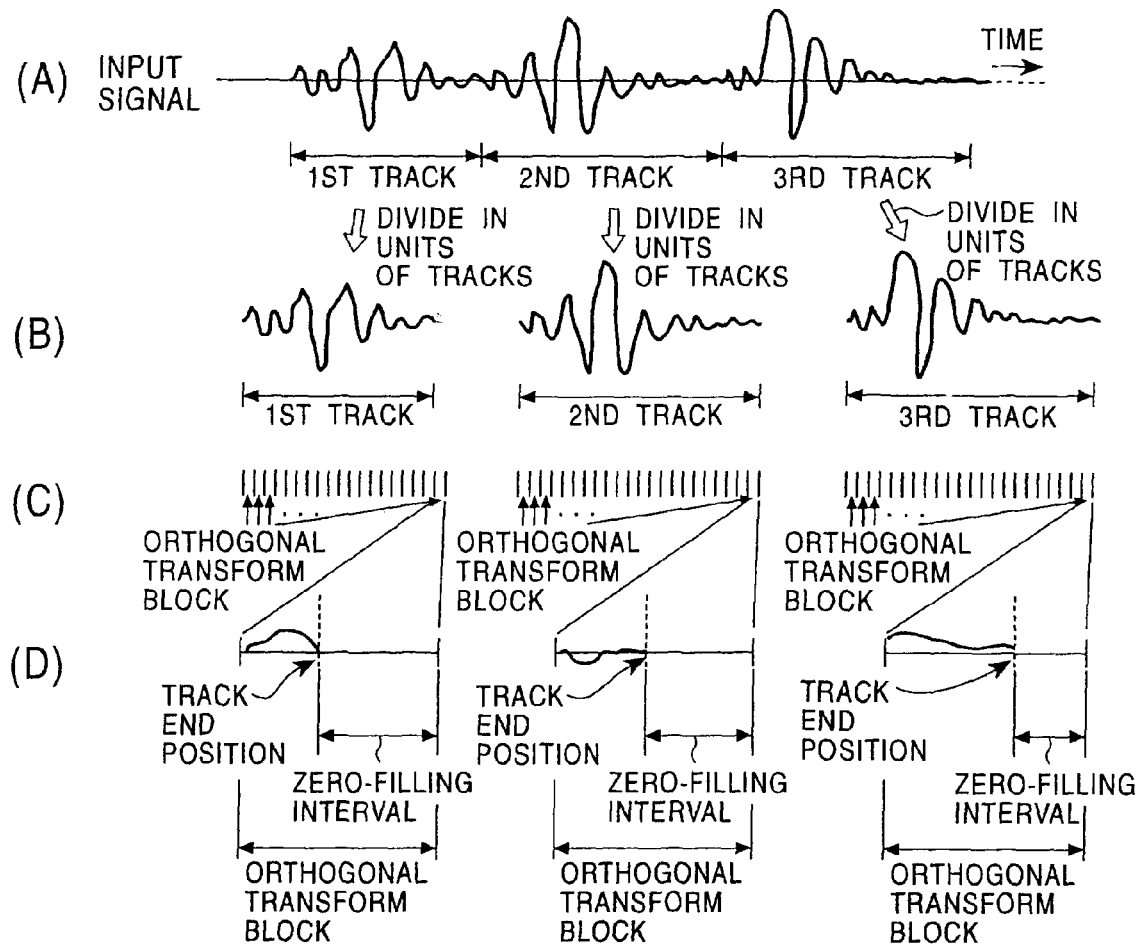
FIG. 1 is a diagram illustrating a conventional audio coding process.
Figure 2:
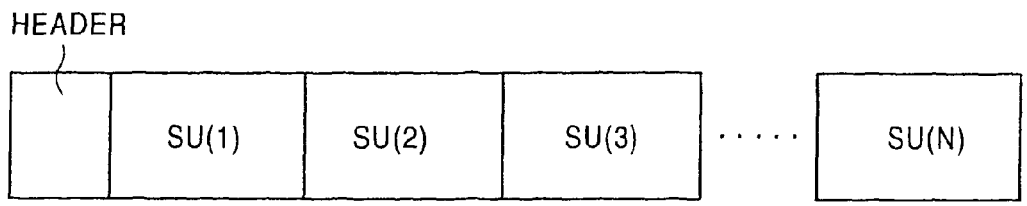
FIG. 2 is a diagram illustrating the structure of coded audio data.
Figure 3:
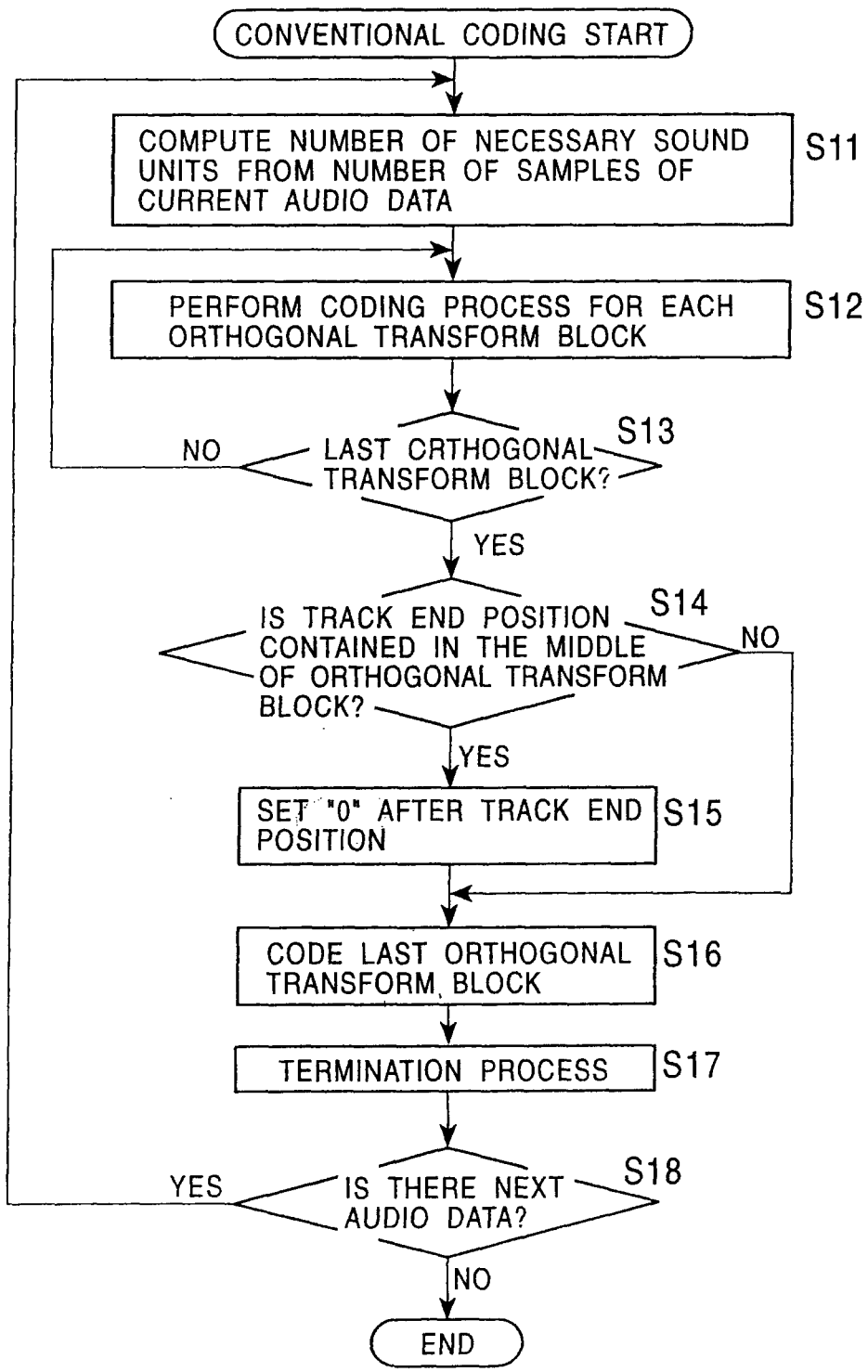
FIG. 3 is a flowchart illustrating a conventional audio coding process.
Figure 4:
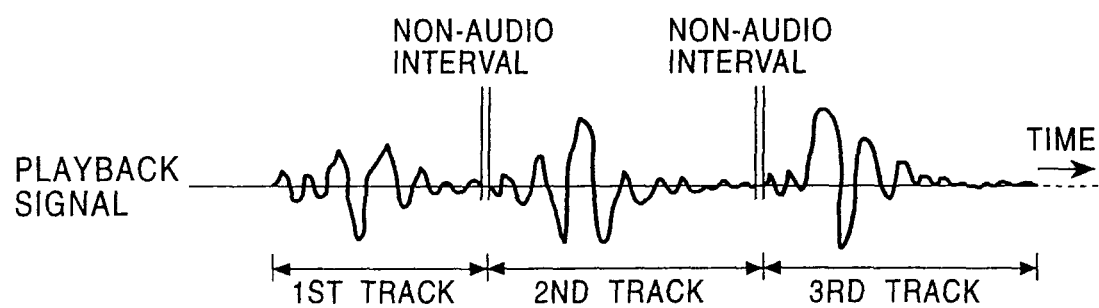
FIG. 4 is a diagram illustrating a no-audio interval.
Figure 5:
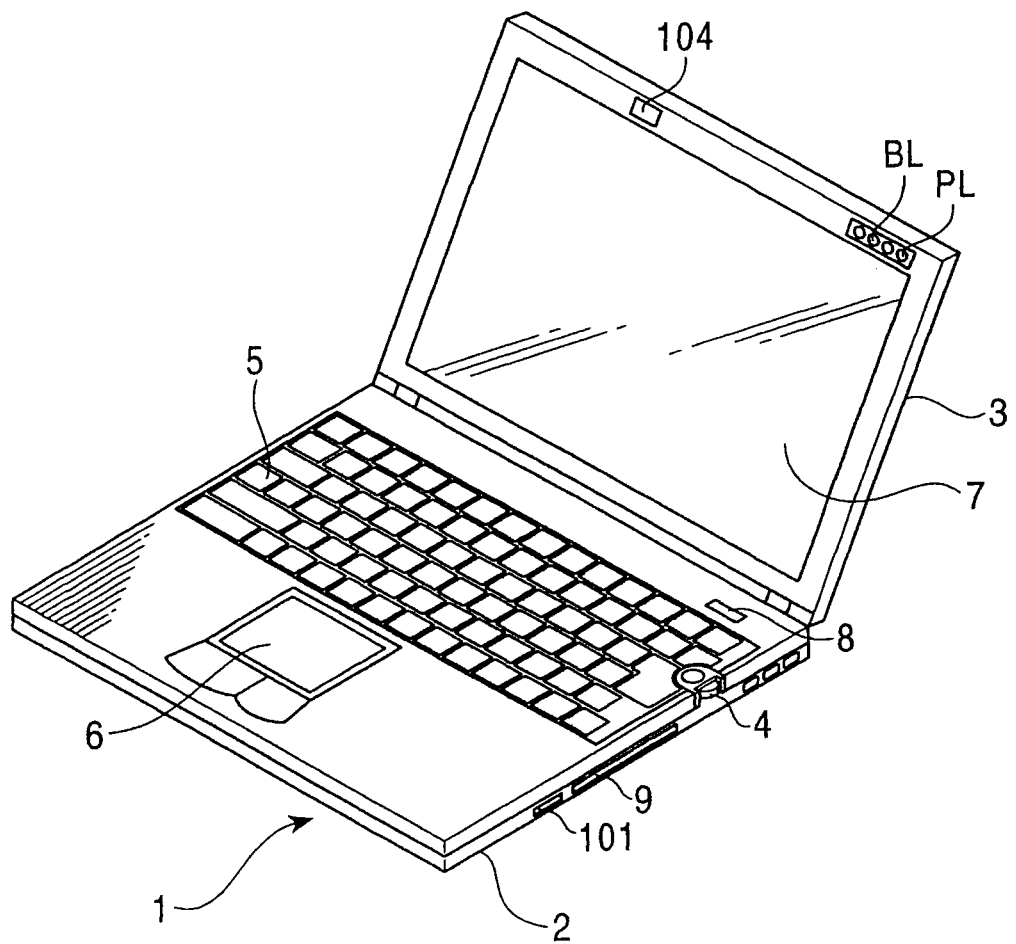
FIG. 5 is a perspective view of the exterior of a personal computer 1 according to the present invention.
Figure 6:
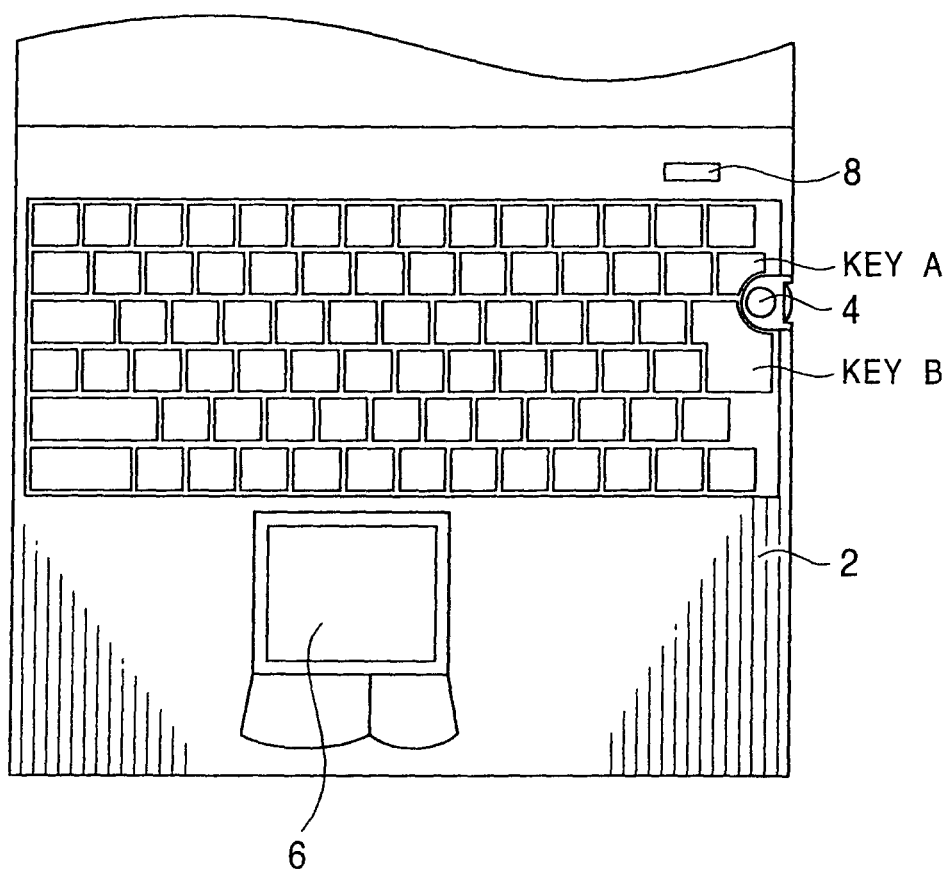
FIG. 6 is a plan view of the personal computer 1.
Figure 7:
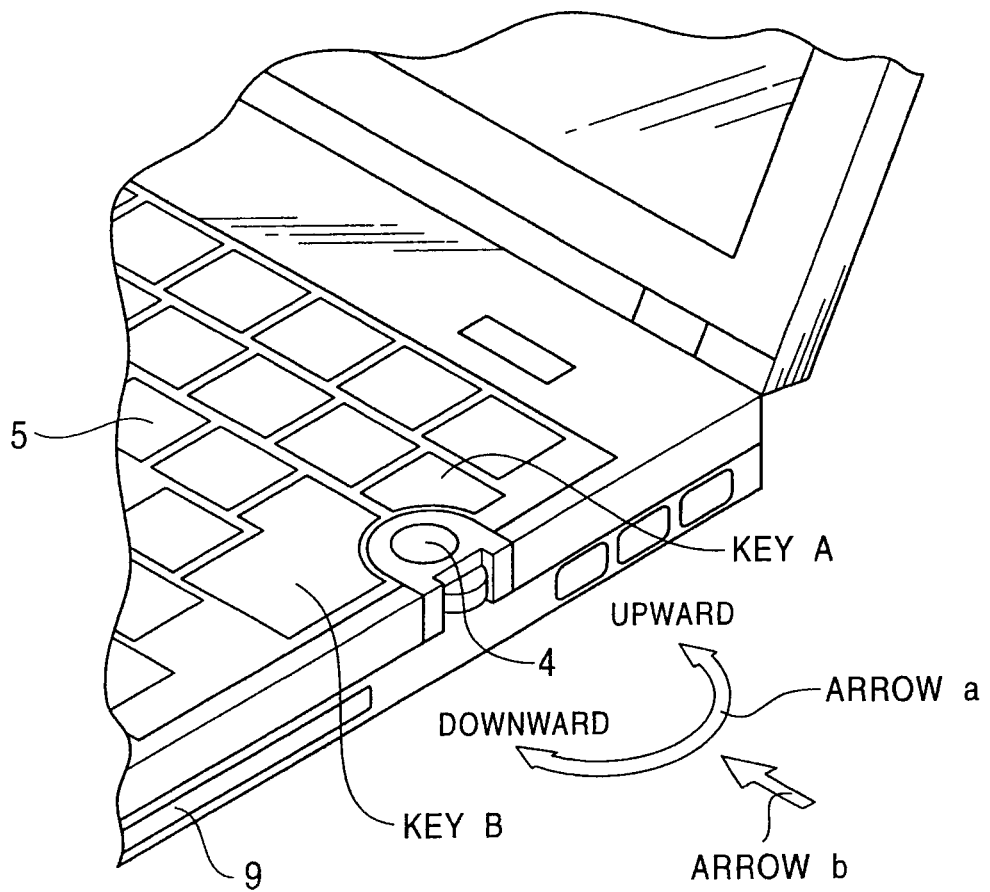
FIG. 7 is an enlarged view of a jog dial 4.
Figure 8:
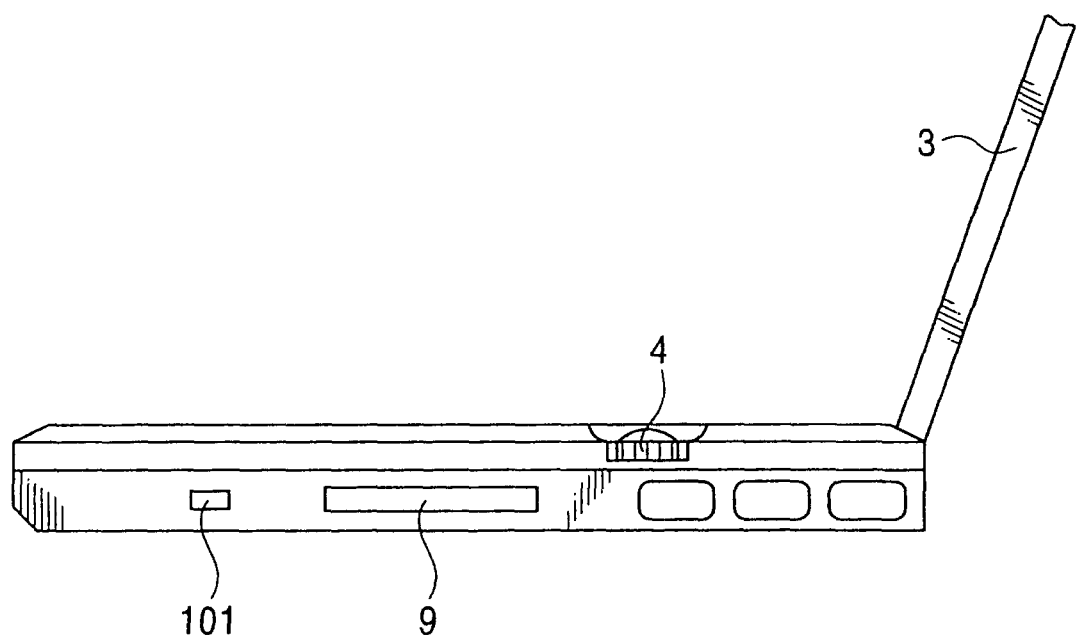
FIG. 8 is a side view of the jog dial 4.

FIGS. 5 to 8 are diagrams showing the exterior of an embodiment of a notebook personal computer according to the present invention. This personal computer 1 basically comprises a main unit 2, and a display section 3 which is openable/closable with respect to this main unit 2. FIG. 5 is a perspective view of the exterior, showing a state in which the display section 3 is open with respect to the main unit 2. FIG. 6 is a plan view of the main unit 2. FIG. 7 is an enlarged view of a jog dial 4 (to be described later) which is provided in the main unit 2. FIG. 8 is a side view of the jog dial 4 which is provided in the main unit 2.

The main unit 2 has a keyboard 5 at the upper surface thereof, which is operated to input various characters, symbols, etc., a touch pad 6 as a pointing device which is operated so as to move a pointer (mouse cursor) displayed on an LCD (Liquid Crystal Display) 7, and a power-supply switch 8. Furthermore, the jog dial 4, an IEEE (Institute of Electrical and Electronics Engineers) 1394 port 101, etc., are provided on the side of the main unit 2. It is also possible to provide a pointing stick-type device in place of the touch pad 6.

The LCD 7 for displaying an image is provided on the front of the display section 3. In the upper right portion of the display section 3, lamps composed of a power-supply lamp PL, a battery lamp BL, a message lamp ML (not shown) which is provided as necessary, and other LEDs are provided. Furthermore, in the upper central portion of the display section 3, a microphone 104 is provided.

The power-supply lamp PL, the battery lamp BL, the message lamp ML, etc., may be alternatively provided in the lower portion of the display section 3.

Next, the jog dial 4 is mounted, for example, between a key A and a key B located on the right side in FIG. 6 of the keyboard 5 on the main unit 2 in such a manner that the top surface of the jog dial 4 is nearly flush with the key A and the key B. The jog dial 4 is used to perform a predetermined process (for example, a screen scrolling process) in such a manner as to correspond to a rotation operation indicated by an arrow "a" in FIG. 7 and to perform a predetermined process (for example, a process for determining the selection of an icon) in such a manner as to correspond to a movement operation indicated by an arrow in FIG. 7.

The jog dial 4 may be located on the left side of the main unit 2, may be located on the left side or the right side of the display section 3, in which the LCD 7 is provided, or may be located in the vertical direction (that is, the jog dial 4 may be rotated in the direction of either the Y key or the B key) between the G key and the H key of the keyboard 5.

Furthermore, the jog dial 4 may be located in the central portion of the front of the main unit 2 so that the jog dial 4 can be operated with the thumb while operating the touch pad 6 with the index finger; the jog dial 4 may be located in the horizontal direction along the upper edge or the lower edge of the touch pad 6; and jog dial 4 may be located in the vertical direction between the right button and the left button of the touch pad 6. Furthermore, the jog dial 4 may be located at a predetermined angle in such a direction as to facilitate operation with each of the fingers without being limited to the vertical direction and the horizontal direction. In addition, the jog dial 4 may also be located at the side of the mouse, which is a pointing device, so as to be operable with the thumb. As a jog dial, a rotation-type electronic part with a push switch, disclosed in Japanese Unexamined Patent Application Publication No. 8-203387, which was filed by the applicant who is also a coapplicant of the present invention, may be used.

Figure 9:
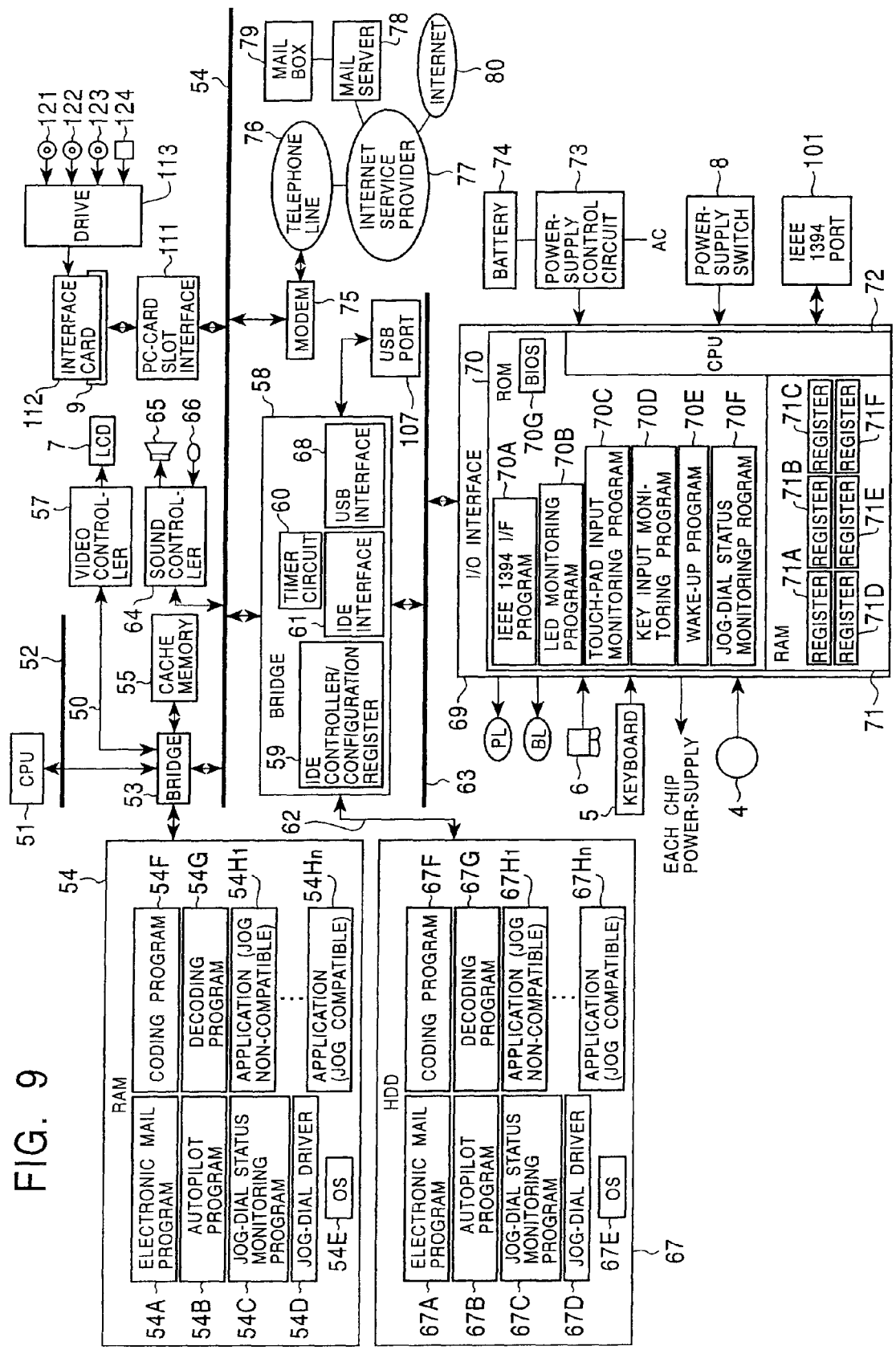
FIG. 9 is a diagram showing the organization of an embodiment of the personal computer 1.

The IEEE 1394 port 101 has a construction in compliance with the standards defined in IEEE 1394, and cables which comply with the standards defined in IEEE 1394 are Next, referring to FIG. 9, the organization of an embodiment of the personal computer 1 is described.

A CPU (Central Processing Unit) 51 comprises, for example, a Pentium (trademark) processor manufactured by Intel Corporation, etc., and is connected to a host bus 52. A bridge 53 (commonly called a "north bridge") is further connected to the host bus 52. The bridge 53 has an AGP (Accelerated Graphics Port) 50 and is connected to a PCI (Peripheral Component Interconnect/Interface) bus 56.

The bridge 53 comprises, for example, 400BX, which is an AGP host bridge controller manufactured by Intel Corporation. The bridge 53 controls a CPU 51, a RAM (Random Access Memory) 54 (commonly called a "main memory"), etc. Furthermore, the bridge 53 controls a video controller 57 via the AGP 50. This bridge 53 and a bridge (commonly called a "south bridge" (PCI-ISA Bridge)) 58 constitute what is commonly called a chip set.

The bridge 53 is further connected to a cache memory 55. The cache memory 55 is formed of a memory, such as an SRAM (Static RAM), which can perform writing and reading operations at higher speed than can RAM 54, and caches (temporarily stores) a program or data used by the CPU 51.

The CPU 51 has contained therein a primary cache memory (a memory which can operate at higher speed than can the cache memory 55 and which is controlled by the CPU 51 itself).

The RAM 54 comprises, for example, a DRAM (Dynamic RAM) and stores a program to be executed by the CPU 51 or data required for the operation of the CPU 51. Specifically, for example, the RAM 54 stores an electronic mail program 54A, an autopilot program 54B, a jog-dial status monitoring program 54C, a jog-dial driver 54D, an operating system (OS) 54E, a coding program 54F, a decoding program 54G, and other application programs 54H1 to 54Hn, which are loaded from a HDD 67 at the time boot-up is completed.

The electronic mail program 54A is a program for exchanging communication text (commonly called "e-mail") through a communication line, such as a telephone line 76, via a modem 75. The electronic mail program 54A has an incoming mail obtaining function. This incoming mail obtaining function queries a mail server 78 provided by an Internet service provider 77 to determine whether or not mail for the user has been received within a mail box 79 thereof and performs a process for obtaining any received mail for the user.

The autopilot program 54B is a program for sequentially starting plural processes (or programs) which are set in advance, etc., in a preset sequence, and for processing them.

The jog-dial status monitoring program 54C receives a notification as to whether or not compatibility with the jog dial 4 is provided from each of the above-described application programs. When compatibility with the jog dial 4 is provided, the jog-dial status monitoring program 54C causes the LCD 7 to display operations which can be performed by operating the jog dial 4.

The jog-dial status monitoring program 54C detects an event (an operation, such as the jog dial 4 being rotated in a direction indicated by arrow "a" in FIG. 7 or being depressed in a direction indicated by arrow "b" in FIG. 7) of the jog dial 4, and performs a process corresponding to the detected event. The jog-dial status monitoring program 54C has a list for receiving a notification from an application program. The jog-dial driver 54D performs various functions in such a manner as to correspond to an operation of the jog dial 4.

The OS (Operating System) 54E is a program for controlling the basic operations of a computer, typified by, for example, Windows 95 (trademark) or Windows 98 (trademark), or Mac OS (trademark) from the Apple Computer Corporation.

The coding program 54F codes predetermined audio data in order to create coded data, and causes the LCD 7 to display a window for inputting an instruction of a coding process. For example, the coding program 54F reads audio data from a CD (Compact Disc), which is an optical disk 122, loaded into a drive 113, performs coding thereon by a method, such as ATRAC, and records the coded data to the HDD 67.

The decoding program 54G decodes the coded data recorded in the HDD 67 in order to play back audio through a speaker 65, and causes the LCD 7 to display a window for inputting an instruction of a decoding process.

The video controller 57 is connected to the bridge 53 via the AGP 50. The video controller 57 receives data (image data, text data, etc.) supplied from the CPU 51 via the AGP 50 and the bridge 53, creates image data corresponding to the received data, or stores the received data as it is in a built-in video memory 161 (to be described later with reference to FIG. 6). The video controller 57 causes the LCD 7 of the display section 3 to display an image corresponding to the image data stored in the video memory 161.

A sound controller 64 is connected to the PCI bus 56. The sound controller 64 receives a signal corresponding to audio from the microphone 66, creates data corresponding to the audio, and outputs it to the RAM 54. Alternatively, the sound controller 64 drives the speaker 65 so as to output audio.

Furthermore, the modem 75 is connected to the PCI bus 56. The modem 75 is used to transmit predetermined data to a communication network 80 such as the Internet, or a mail server 78, via a public telephone line 76 and an Internet service provider 77, and is used to receive predetermined data from the communication network 80 or the mail server 78.

A PC-card slot interface 111, which is connected to the PCI bus 56, supplies data supplied from an interface card 112 loaded into a slot 9 to the CPU 51 or the RAM 54, and outputs data supplied from the CPU 51 to the interface card 112. The drive 113 is connected to the PCI bus 56 via the PC-card slot interface 111 and the interface card 112.

The drive 113 reads data recorded in a magnetic disk 121, an optical disk 122, a magneto-optical disk 123, or a semiconductor memory 124, which is loaded, supplies the read data to the RAM 54 via the PC-card slot interface 111, the interface card 112, and the PCI bus 56.

Furthermore, the bridge 58 (commonly called a "south bridge") is also connected to the PCI bus 56. The bridge 58 comprises, for example, PIIX4E, manufactured by Intel Corporation, and has contained therein an IDE (Integrated Drive Electronics) controller/configuration register 59, a timer circuit 60, an IDE interface 61, a USB interface 68, etc. The bridge 58 controls various types of I/O (Input/Output), such as control of devices which are connected to an IDE bus 62 or devices which are connected via an ISA/EIO (Industry Standard Architecture/Extended Input Output) bus 63 or an I/O interface 69.

The IDE controller/configuration register 59 comprises two IDE controllers, commonly called a primary IDE controller and a secondary IDE controller, configuration registers, etc. (not shown).

The HDD 67 is connected to the primary IDE controller via the IDE bus 62. Furthermore, in another IDE bus, when what is commonly called an IDE device, such as a CD-ROM drive or a HDD (not shown), is loaded, the IDE device is electrically connected to the secondary IDE controller.

The HDD 67 has recorded therein an electronic mail program 67A, an autopilot program 67B, a jog-dial status monitoring program 67C, a jog-dial driver 67D, an OS 67E, and a coding program 67F, a decoding program 67G, and other plural application programs 67H1 to 67Hn as application programs. The electronic mail program 67A, the autopilot program 67B, the jog-dial status monitoring program 67C, the jog-dial driver 67D, the OS 67E, the coding program 67F, the decoding program 67G, and the application programs 67H1 to 67Hn, which are recorded in the HDD 67, are supplied in sequence to the RAM 54 so as to be loaded in the boot-up process.

The USB (Universal Serial Bus) interface 68 outputs (for example, checks out) audio data to a connected portable device (not shown) via a USB port 107.

The timer circuit 60 supplies data indicating the current time to the CPU 51 via the PCI bus 56 in such a manner as to correspond to a request of the coding program 67F.

The I/O interface 69 is further connected to the ISA/EIO bus 63. This I/O interface 69 comprises an embedded controller in which a ROM 70, a RAM 71, and a CPU 72 are interconnected.

The ROM 70 has prestored therein an IEEE 1394 I/F program 70A, an LED monitoring program 70B, a touch-pad input monitoring program 70C, a key input monitoring program 70D, a wake-up program 70E, a jog-dial status monitoring program 70F, etc.

The IEEE 1394 interface program 70A transmits and receives data (data stored in packets) which conforms to the standards defined in IEEE 1394 via the IEEE 1394 port 101. The LED monitoring program 70B performs switch-on control of lamps composed of a power-supply lamp PL, a battery lamp BL, a message lamp ML where necessary, and other LEDs. The touch-pad input monitoring program 70C is a program for monitoring input from the touch pad 6, corresponding to an operation by the user.

The key input monitoring program 70D is a program for monitoring input from the keyboard 5 or another key switch. The wake-up program 70E is a program for checking if a preset time has been reached on the basis of data showing the current time, supplied from the timer circuit 60 of the bridge 58, and for managing the power supply of each chip which is a constituent of the personal computer 1 so that a predetermined process (or a program), etc., is started when the set time has reached. The jog-dial status monitoring program 70F is a program for continuously monitoring whether or not the rotary encoder of the jog dial 4 has been rotated and whether or not the jog dial 4 has been pressed.

A BIOS (Basic Input/Output System) 70G is further written into the ROM 70. The BIOS 70G controls exchange (input/output) of data between the OS or an application program, and peripheral devices (the touch pad 6, the keyboard 5, the HDD 67, etc.).

The RAM 71 has separate registers for LED control, touch pad input status, key input status, and a set time, an I/O register for monitoring jog dial status, an IEEE 1394 I/F register, etc., as registers 71A to 71F. For example, in the LED control register, when the jog dial 4 is depressed and the electronic mail program 54A is started, a predetermined value is stored, and the switch-on of the message lamp ML is controlled in such a manner as to correspond to the stored value. In the key input status register, a predetermined operation key flag is stored when the jog dial 4 is depressed. In the set time register, a predetermined time is set in such a manner as to correspond to an operation of the keyboard 5, etc., by the user.

Furthermore, the jog dial 4, the touch pad 6, the keyboard 5, the IEEE 1394 port 101, etc., are connected to the I/O interface 69. The I/O interface 69 outputs to the ISA/EIO bus 63 a signal corresponding to the operation of each of the jog dial 4, the touch pad 6, and the keyboard 5. Furthermore, the I/O interface 69 controls transmission and reception of data to and from a connected device via the IEEE 1394 port 101. In addition, lamps composed of the power-supply lamp PL, the battery lamp BL, the message lamp ML, a lamp for a power-supply control circuit 73, and other LEDs are connected to the I/O interface 69.

The power-supply control circuit 73 is connected to a built-in battery 74 or an AC power-supply. The power-supply control circuit 73 supplies necessary power to each block, and performs control for charging the built-in battery 74 or a second battery of a peripheral device. Furthermore, the I/O interface 69 monitors the power-supply switch 8 which is operated when the power supply is switched on or off.

Even when the power supply is off, the I/O interface 69 executes the IEEE 1394 interface program 70A to the jog-dial status monitoring program 70F by using the power provided therein. That is, the IEEE 1394 interface program 70A to the jog-dial status monitoring program 70F are operating at all times.

Therefore, even when the power-supply switch 8 is off and the CPU 51 is not executing the OS 54E, since the I/O interface 69 executes the jog-dial status monitoring program 70F, when, for example, the jog dial 4 is depressed in a power-saving state or in a power-off state, the personal computer 1 starts a process of predetermined software or a script file, which is set in advance.

As described above, in the personal computer 1, since the jog dial 4 has a programmable power key (PPK) function, a dedicated key need not be provided.

Figure 10:
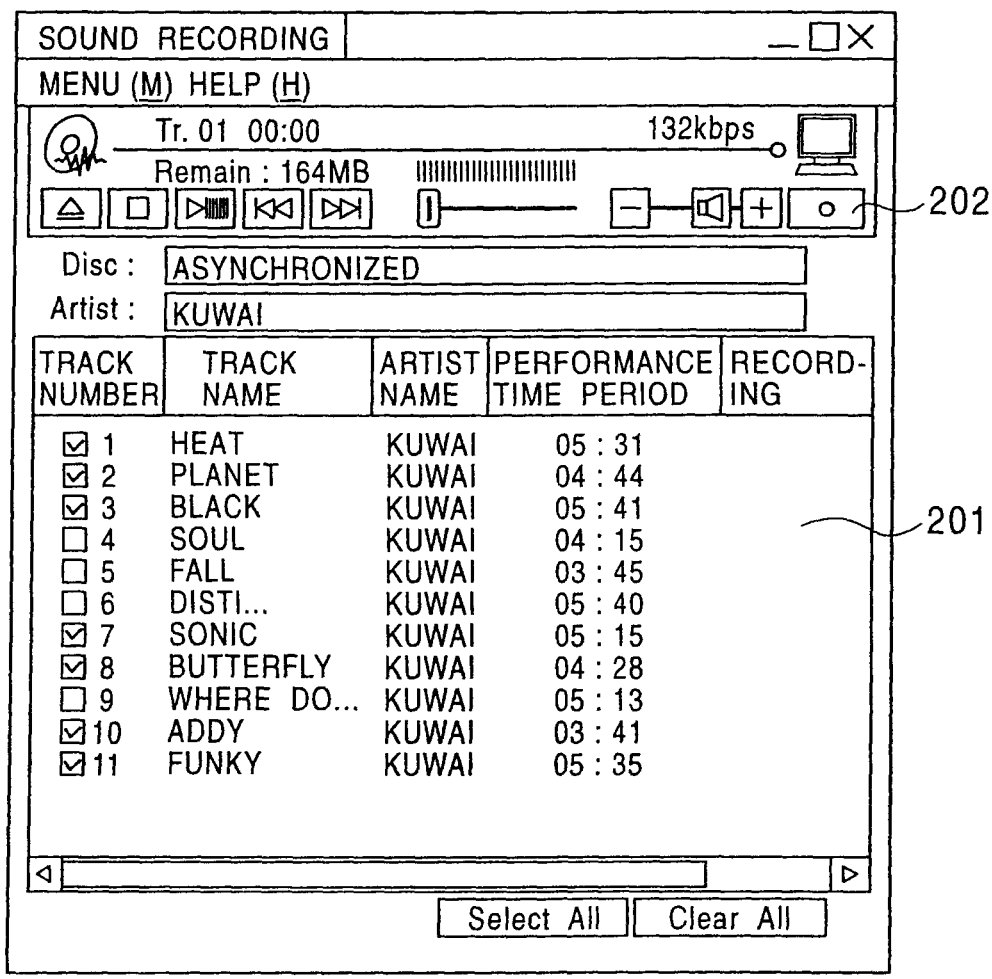
FIG. 10 is a diagram showing a window which is displayed on an LCD 7 by a coding program 54F.

FIG. 10 is a diagram showing a window which is displayed on the LCD 7 by the coding program 54F. In the window which is displayed by the coding program 54F, a field 201 for displaying the name of an audio data file (i.e., the title of the musical piece) recorded on a CD, which is the optical disk 122, loaded into the drive 113, a button 202 for starting a coding process, etc., are placed.

On the left side in the figure of the field 201, check boxes are placed for setting whether or not the coding of audio data should be performed in such a manner as to correspond to the name of the audio data.

For example, as shown in FIG. 10, for the audio data named "HEAT", the audio data named "PLANET", the audio data named "BLACK", the audio data named "SONIC", the audio data named "BUTTERFLY", the audio data named "ADDY", and the audio data named "FUNKY", which are recorded on a CD, which is the optical disk 122, loaded into the drive 113, a check is set in the check boxes on the field 201, respectively. As a result, when the button 202 is clicked, the audio data is coded by the coding program 54F. The coding program 54F then records the coded data corresponding to the respective audio data in the HDD 67.

A set of sequential musical pieces (musical pieces whose track numbers are in sequence), shown in FIG. 10, like the audio data named "HEAT", the audio data named "PLANET", and the audio data named "BLACK", is called a group. The audio data named "SONIC" and the audio data named "BUTTERFLY" belong to one group. Similarly, the audio data named "ADDY" and the audio data named "FUNKY" belong to one group.

As shown in FIG. 10, for the audio data named "SOUL", the audio data named "FALL", the audio data named "DISTI . . . ", and the audio data named "WHERE DO . . . ", which are recorded on a CD, which is the optical disk 122, loaded into the drive 113, the corresponding check box is not checked. As a result, even when the button 202 is clicked, the audio data is not coded.

Next, a process for coding audio data by the coding program 54F is described.

When audio data (for example, the audio data named "HEAT", the audio data named "PLANET", the audio data named "SONIC", or the audio data named "ADDY" in FIG. 10) which belongs to a predetermined group and which is not at the end of the group is to be coded, the coding program 54F determines whether or not the position of the back end of the orthogonal transform block located at the end of the audio data matches the track end position. When it is determined that the position of the back end of the orthogonal transform block located at the end of each audio data does not match the track end position, samples to be stored in the orthogonal transform block located at the end of the audio data are placed at the start of the first orthogonal transform block of the next audio data (the next musical piece).

Figure 11:
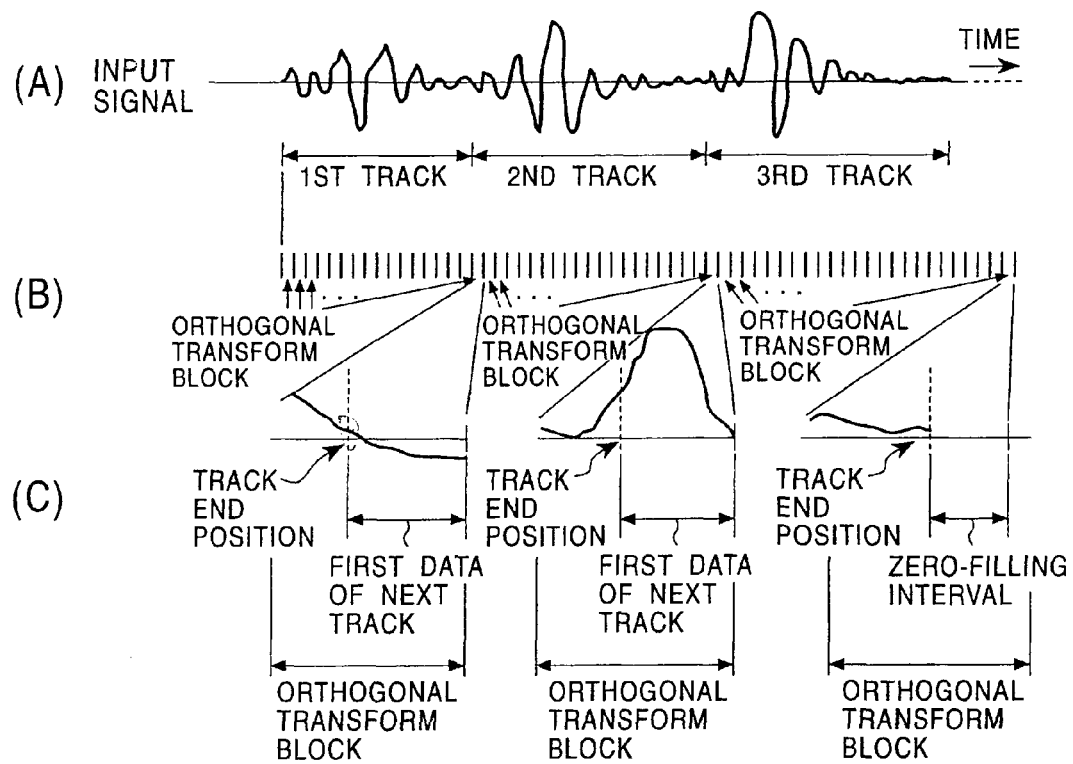
FIG. 11 is a diagram illustrating a coding process by the coding program 54F.

For example, as shown in part (A) of FIG. 11, in a case where the audio data corresponding to the first track in the figure, the audio data corresponding to the second track, and the audio data corresponding to the third track, which belong to the same group, are to be coded, the coding program 54F causes orthogonal transform blocks to correspond to the entirety of the audio data corresponding to the first track, the audio data corresponding to the second track, and the audio data corresponding to the third track, as shown in part (B) of FIG. 11.

As shown in part (C) of FIG. 11, in a case where the track end position is located in the middle of the last orthogonal transform block corresponding to the audio data which is not at the end of the group, the coding program 54F stores the samples of the audio data of the next musical piece in such a manner as to follow the orthogonal transform block.

When the track end position is located in the middle of the last orthogonal transform block corresponding to the audio data which is at the end of the group, the coding program 54F stores data, which is "0", in the orthogonal transform block, following the samples of the audio data of the orthogonal transform block.

Although the description below is in part the same as that for the case of FIG. 11, in a case where, as shown in part (A) of FIG. 12, plural audio data belonging to a group are to be coded, when, as shown in part (B) of FIG. 12, orthogonal transform blocks are made to correspond to the entirety of plural audio data belonging to a group, as shown in part (C) of FIG. 12, the coding program 54F creates, following the samples of the audio data of the previous musical piece, an orthogonal transform block in which samples of the audio data of the next musical piece are stored, and codes the block.

Figure 12:
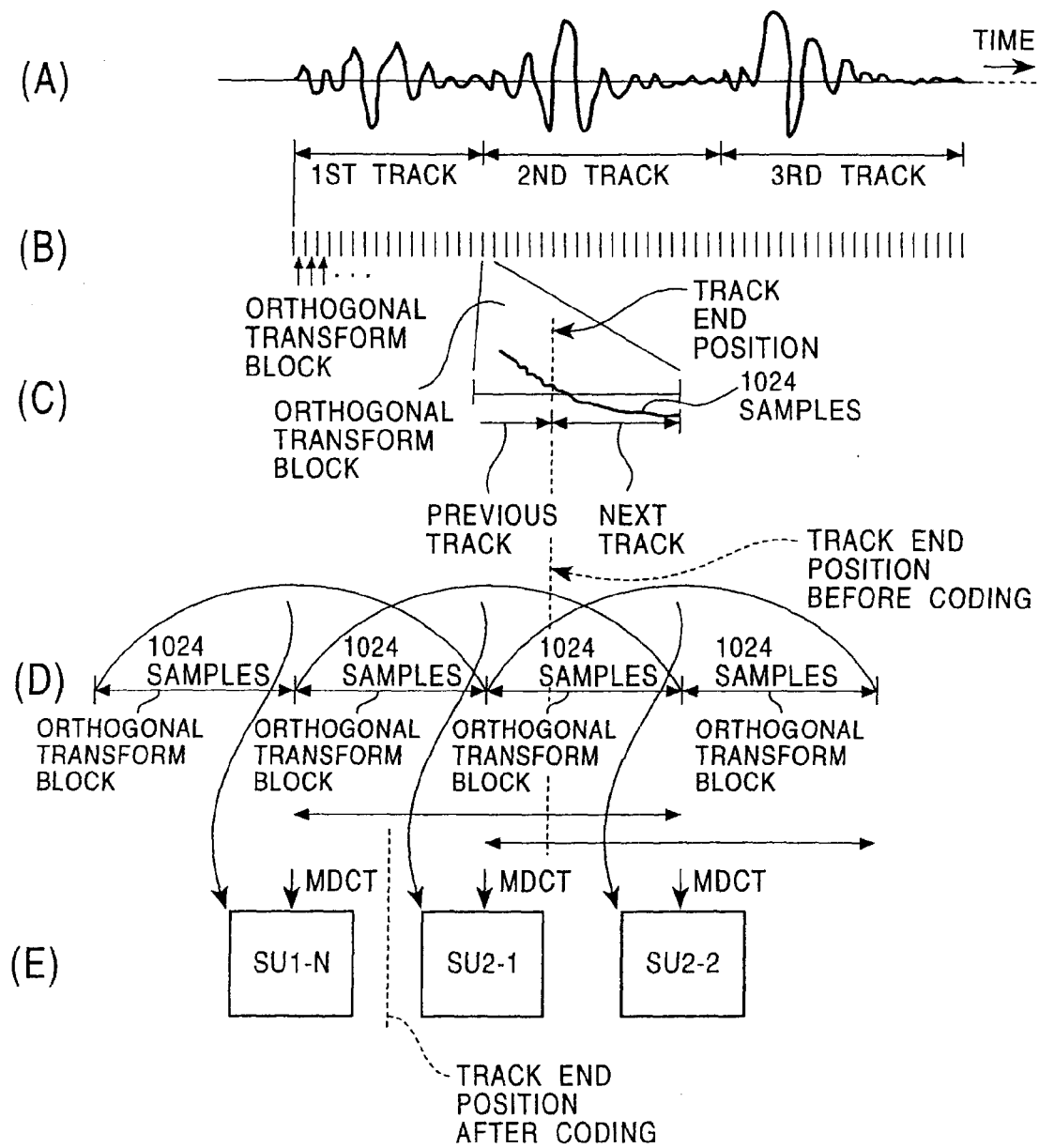
FIG. 12 is a diagram illustrating a coding process by the coding program 54F.

As shown in part (D) of FIG. 12, the coding program 54F applies an MDCT (Modified Discrete Cosine Transform) on the orthogonal transform block in which the samples of the audio data of the next musical piece are stored following the samples of the audio data of the previous musical piece and on the orthogonal transform block located before the orthogonal transform block in order to create an SU 2-1, which is coded data, as shown in part (E) of FIG. 12. This SU 2-1 becomes an SU which is located at the start of the coded data of the next musical piece.

Figure 13:
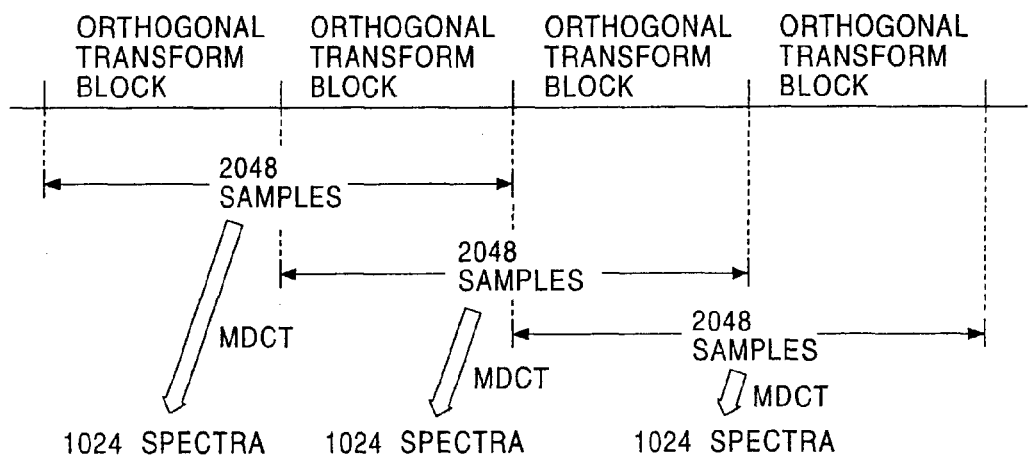
FIG. 13 is a diagram illustrating a coding process.

As shown in FIG. 13, an SU is created as a result of an MDCT being applied to two orthogonal transform blocks containing 1024 samples (that is, to 2048 samples), and contains 1024 spectra. The next SU is created as a result of an MDCT being applied to two of the orthogonal transform block used for the creation of the previous SU and the next orthogonal transform block.

As described above, the respective SUs are created by a transform based on the orthogonal transform block used for the creation of the previous SU and the next orthogonal transform block, that is, an overlap transform.

The coding program 54F performs an MDCT, following the samples of the audio data of the previous musical piece, on the orthogonal transform block in which the samples of the audio data of the next musical piece are stored and on the orthogonal transform block located next to the orthogonal transform block, thereby creating an SU 2-2. This SU 2-2 becomes an SU which is located second from the start of the coded data of the next musical piece.

Figure 14:
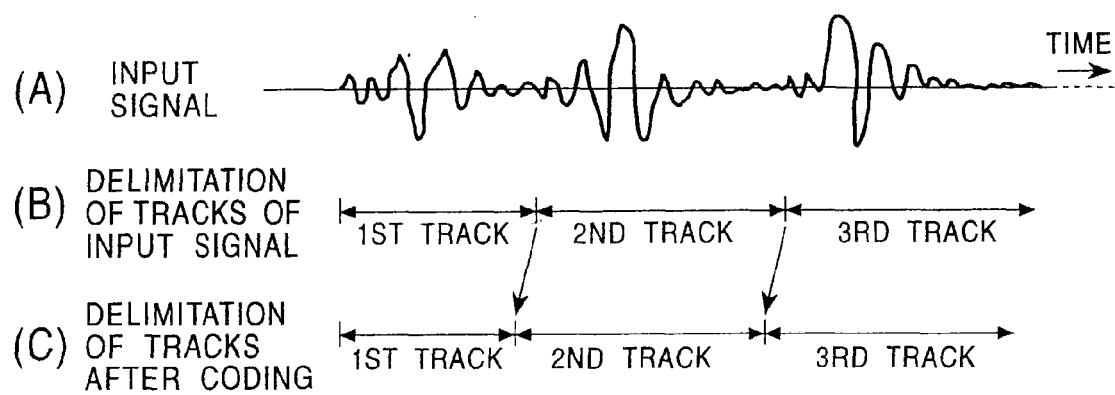
FIG. 14 is a diagram illustrating musical data which is coded by the coding program 54F.

Therefore, with respect to an input signal shown in part (A) of FIG. 14, when the position of the back end of the orthogonal transform block does not match the track end position as shown in part (B) of FIG. 14, the samples at the end of the previous musical piece are used to create the first SU of the coded data of the next musical piece. As a result, a no-audio interval is not created in the coded data, and as shown in part (C) of FIG. 14, the track end position of the audio data after being coded is moved forward in comparison with that before being coded.

The coding program 54F may store data for specifying coded data which is coded following previous or next data, in the coded data (for example, the header) when sequential audio data is coded.

Figure 15:
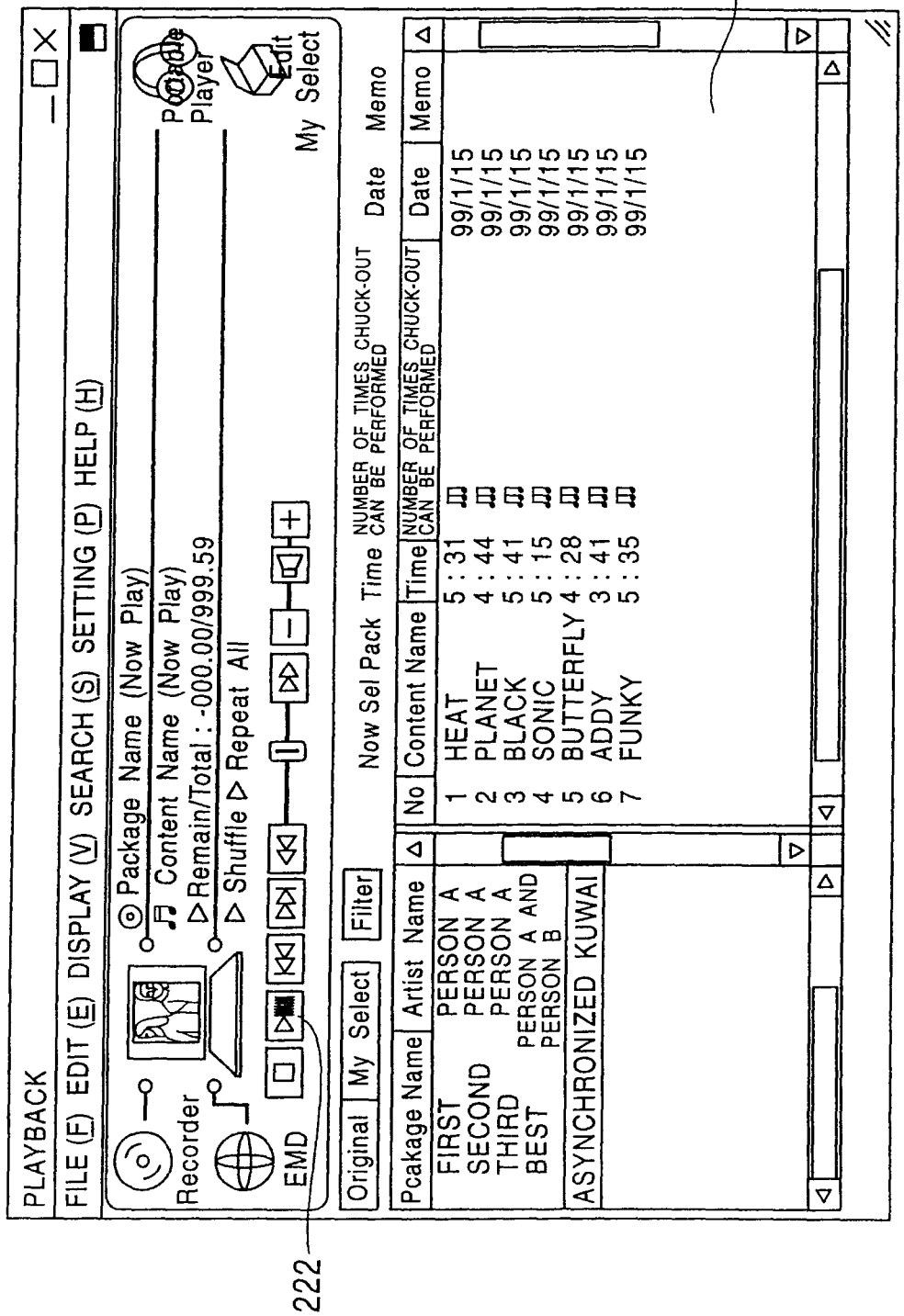
FIG. 15 is a diagram showing a window which is displayed on the LCD 7 by a decoding program 54G.

FIG. 15 is a diagram showing a window such that the decoding program 54G causes the LCD 7 to display. In the window displayed by the decoding program 54G, a field 221 for displaying the name (i.e., the title of the musical piece) of coded data to be decoded, a button 222 for starting a decoding process, etc., are placed.

For example, in FIG. 15, when the name "HEAT" and the name "PLANET", shown in the field 221, are selected and the button 222 is clicked, the decoding program 54G decodes in sequence the coded data corresponding to "HEAT" and the coded data corresponding to "PLANET", recorded in the HDD 67, and causes the speaker 65 to output audio corresponding to the decoded audio signal.

Next, a description is given of a process of decoding coded data for sequential musical pieces (for example, musical pieces in which the numbers shown in the field 221 are in sequence) by the decoding program 54G.

Figure 16:
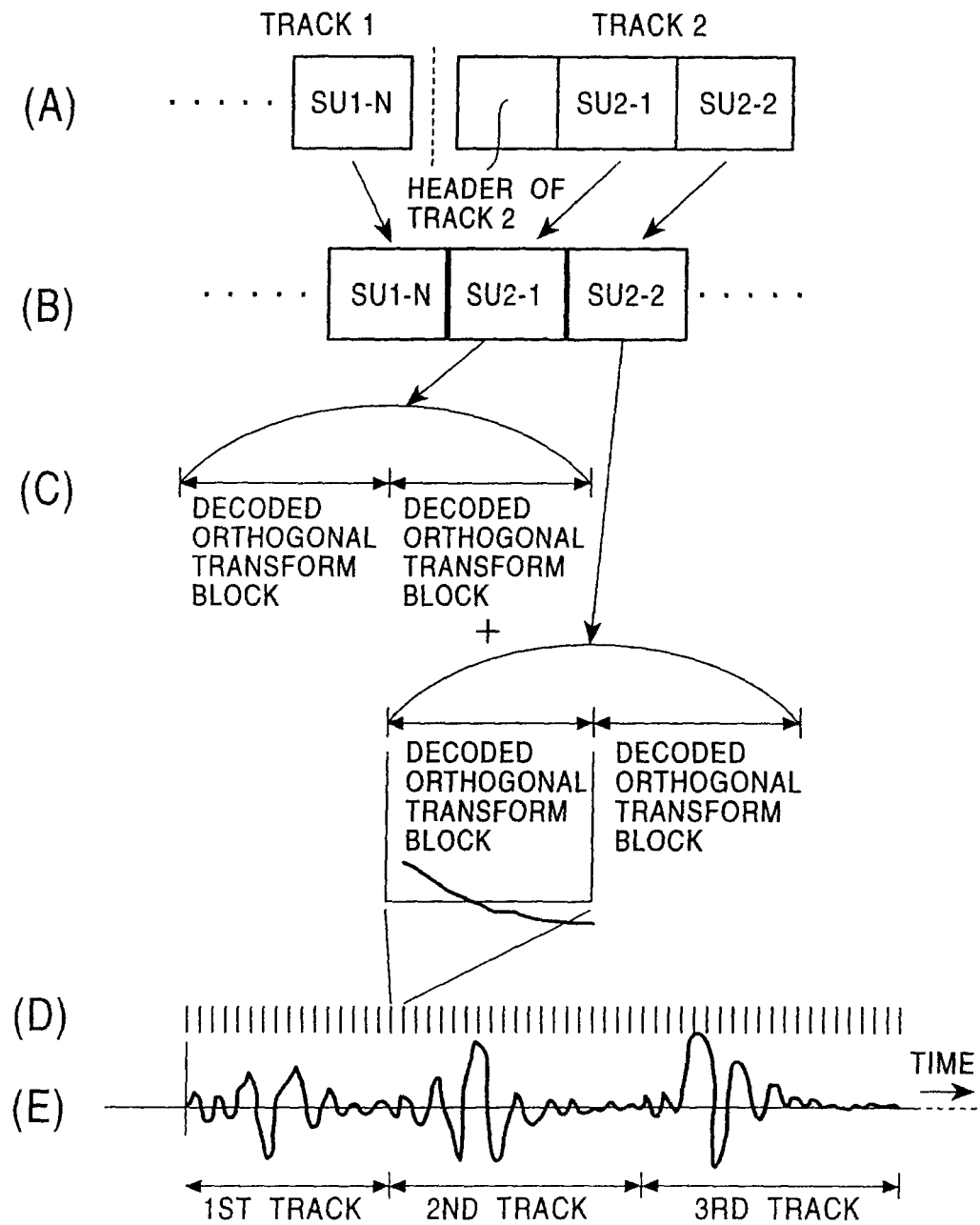
FIG. 16 is a diagram illustrating a decoding process by the decoding program 54G.

The decoding program 54G determines whether or not coded data is sequential, as shown in part (A) of FIG. 16.

When it is determined that the coded data to be decoded is sequential, the decoding program 54G deletes the header from the next coded data (the coded data corresponding to the track 2 in the figure), as shown in part (B) of FIG. 16 so as to concatenate the previous coded data and the next coded data which are sequential in the same group.

The decoding program 54G may determine whether or not the coded data to be decoded is the coded data obtained by coding sequential audio data on the basis of the data stored in the header, etc.

The decoding program 54G decodes the SUs of the concatenated coded data continuously as shown in part (C) of FIG. 16 so as to create a decoded orthogonal transform block. The decoding program 54G performs addition in such a manner that predetermined portions of the decoded orthogonal transform block overlap so as to create the original orthogonal transform block (including the original samples), as shown in part (D) of FIG. 16.

Figure 17:
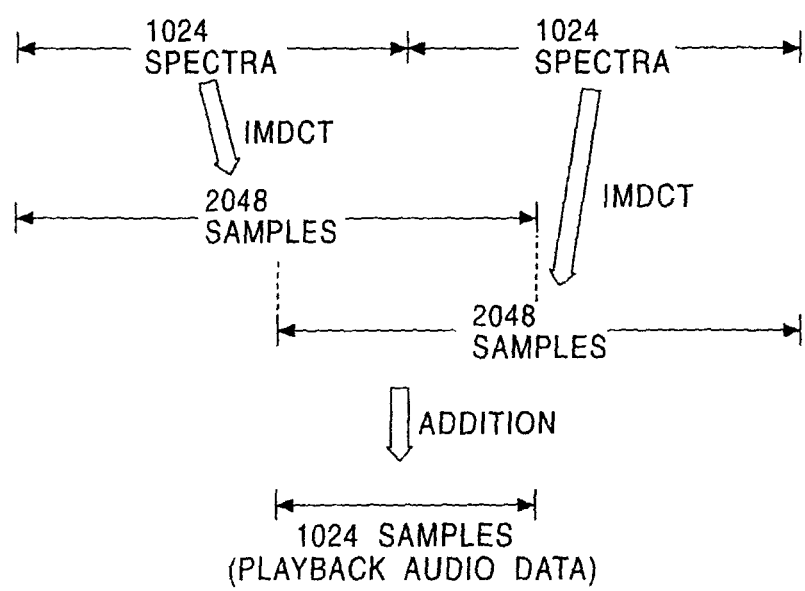
FIG. 17 is a diagram illustrating a decoding process.

More specifically, as shown in FIG. 17, the decoding program 54G applies an IMDCT (Inverse Modified Discrete Cosine Transform) on an SU containing 1024 spectra, thereby creating 2048 samples. The decoding program 54G applies an IMDCT on the next SU, thereby creating 2048 samples.

The decoding program 54G adds 1024 samples in the back portion within the 2048 samples created previously and 1024 samples in the forward portion within the 2048 samples created afterward, thereby creating playback audio data (corresponding to the orthogonal transform block before being coded) of 1024 samples.

Therefore, it is possible for the decoding program 54G to decode sequential coded data smoothly, without creating a no-audio interval, for playback, as shown in part (E) of FIG. 16.

Figure 18:
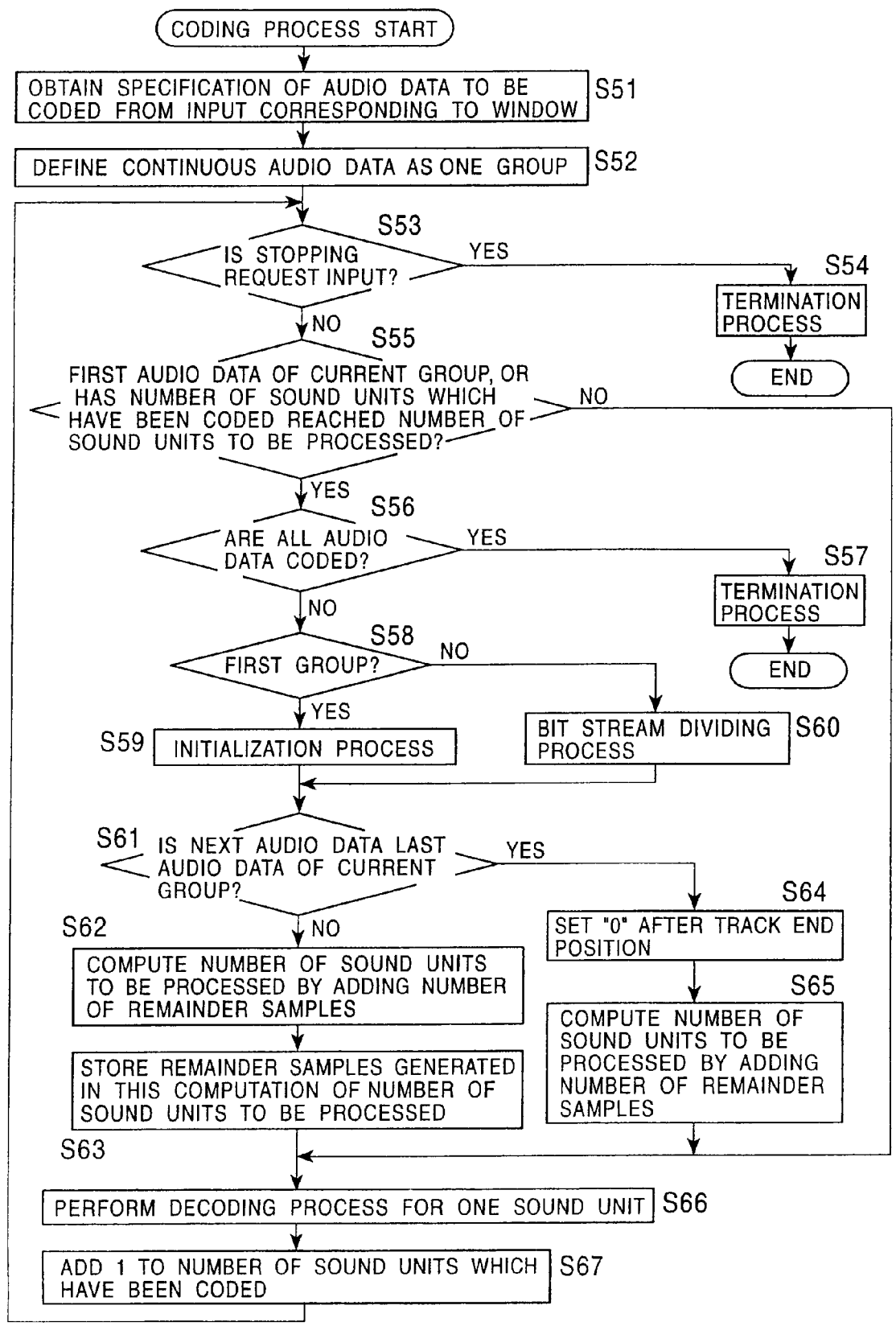
FIG. 18 is a flowchart illustrating a coding process by the coding program 54F.

Next, referring to the flowchart in FIG. 18, a coding process by the coding program 54F is described. In step S51, the coding program 54F obtains specification of audio data to be coded from an input corresponding to a window displayed on the LCD 7. In step S52, the coding program 54F defines the sequential audio data within the audio data specified in step S51 as one group.

In step S53, the coding program 54F determines whether or not a stopping request has been input as a result of the keyboard 5 or the touch pad 6 being operated. When it is determined that a stopping request has been input, the process proceeds to step S54, whereby a termination process, such as closing a predetermined file, is performed, and the processing is terminated.

When it is determined in step S53 that a stopping request has not been input, the process proceeds to step S55, whereby the coding program 54F determines whether or not the coded data is the audio data at the start of the current group or whether or not the number of SUs which have been coded has reached the number of SUs to be processed. When it is determined that the coded data is the audio data at the start of the current group or the number of SUs which have been coded has reached the number of SUs to be processed, the process proceeds to step S56, whereby it is determined whether or not all the specified audio data has been coded.

When it is determined in step S56 that all the specified audio data has been coded, since the coding process has been terminated, the process proceeds to step S57, whereby a termination process, such as closing a predetermined file, is performed, and the processing is terminated.

When it is determined in step S56 that all the specified audio data has not been coded, the process proceeds to step S58, whereby the coding program 54F determines whether or not audio data to be coded next is at the start of the group.

When it is determined that the audio data to be coded next is at the start of the group, the process proceeds to step S59, whereby an initialization process, such as adding a header, is performed, and the process proceeds to step S61.

When it is determined in step S58 that the audio data to be coded next is not at the start of the group, the process proceeds to step S60, whereby the coding program 54F performs a process of dividing a bit stream (setting tracks of the coded data), and the process proceeds to step S61.

In step S61, the coding program 54F determines whether or not the next audio data is the audio data at the end of the current group. When it is determined that the next audio data is not the audio data at the end of the current group, since the audio data following the next audio data is in the current group, the process proceeds to step S62, whereby the number of remainder samples of the previous audio data is added to compute the number of SUs to be processed.

In step S63, the coding program 54F stores (for example, stores in the RAM 54 or records in the HDD 67) the remainder samples generated in the computation of the SUs to be processed for this time, and the process proceeds to step S66.

When it is determined in step S61 that the next audio data is the audio data at the end of the current group, the process proceeds to step S64, whereby the coding program 54F sets a predetermined number of "0" after the track end position of the next audio data. In step S65, the coding program 54F computes the number of SUs to be processed by adding the number of remainder samples, and the process proceeds to step S66.

In step S66, the coding program 54F performs a coding process for one SU. In step S67, the coding program 54F adds 1 to the number of SUs which have been coded, the process returns to step S53, and the coding process is repeated.

When it is determined in step S55 that the coded data is not the audio data at the start of the current group and the number of SUs which have been coded has not reached the number of SUs to be processed, since processing is in the middle of the coding process, the process proceeds to step S66, and the coding process is repeated.

As described above, the coding program 54F performs a coding process continuously without setting "0" in the sequential audio data which belongs to a group.

Next, referring to the flowchart in FIG. 19, a decoding process by the decoding program 54G is described. In step S81, the decoding program 54G obtains specification of coded data to be decoded from an input corresponding to the window displayed on the LCD 7. In step S82, the decoding program 54G defines the sequential coded data within the coded data specified in step S81 as one group.

In step S83, the decoding program 54G determines whether or not a stopping request has been input as a result of the keyboard 5 or the touch pad 6 being operated. When it is determined that a stopping request has been input, the process proceeds to step S90, whereby a termination process, such as closing a predetermined file, is performed, and the processing is terminated.

When it is determined in step S83 that a stopping request has not been input, the process proceeds to step S84, whereby the decoding program 54G determines whether or not the coded data to be decoded is coded data which follows the previous coded data within the group. When it is determined that the coded data to be decoded is coded data which follows the previous coded data within the group, the process proceeds to step S85, whereby the header of the coded data which follows the previous coded data within the group is deleted, and the process proceeds to step S87. The decoding program 54G concatenates the coded data which follows the previous coded data within the group and the previous coded data.

When it is determined in step S84 that the coded data to be decoded is not coded data which follows the previous coded data within the group, since it is single coded data (coded data which does not belong to a group) or it is the coded data at the start of the group, the process proceeds to step S86, whereby the decoding program 54G performs an initialization process, and the process proceeds to step S87.

In step S87, the decoding program 54G performs a process of decoding the coded data. In step S88, the decoding program 54G outputs an audio signal corresponding to the audio data obtained by decoding the coded data through the speaker 65.

In step S89, the decoding program 54G determines whether or not all the specified coded data has been decoded. When it is determined that all the specified coded data has not been decoded, the process returns to step S83, and a process of decoding the next coded data is repeated.

When it is determined in step S89 that all the specified coded data has been decoded, the processing is terminated.

As described above, it is possible for the decoding program 54G to decode sequential coded data which belongs to a group without creating a no-audio interval so that audio is played back smoothly.

The coding method is not limited to ATRAC, and any method may be used as long as it is a method which performs coding with a predetermined number of samples being treated as one unit.

The above-described series of processing can be performed by hardware and can also be performed by software. In a case where the series of processing is to be performed by software, programs which form the software are installed from a program recording medium into a computer incorporated into dedicated hardware or, for example, a general-purpose personal computer capable of executing various types of functions by installing various programs.

This program recording medium, as shown in FIG. 9, is constructed by not only package media formed of the magnetic disk 121 (including a floppy disk), the optical disk 122 (including a CD-ROM (Compact Disc-Read Only Memory), and a DVD (Digital Versatile Disc)), the magneto-optical disk 123 (including an MD (Mini-Disc)), or the semiconductor memory 124, in which programs which are installed into a computer so as to be executable by the computer are stored, but also is constructed by the ROM, a hard disk contained in the HDD 67, etc., in which programs are stored temporarily or permanently. Storing programs in a program storage medium is performed by using a cable or wireless communication medium, such as a local area network, the Internet 80, or a digital satellite broadcast via an interface such as a router or the modem 75, as necessary.

In this specification, steps which describe a program stored in a program recording medium contain not only processing performed in a time-series manner along the described sequence, but also processing performed in parallel or individually although the processing is not necessarily performed in a time-series manner.

In this specification, the system represents the overall apparatus composed of plural devices.

According to the coding apparatus, the coding method, and the program storage medium of the present invention, in a case where plural audio data is to be coded, the respective audio data is grouped into one audio data, the grouped audio data is coded in sequence with a predetermined number of samples being treated as units, and delimitations corresponding to the delimitations of plural audio data are set in the coded data at coding units of the coded data. Thus, it is possible to obtain coded data which does not strike viewers and listeners as being incongruous.

In addition, according to the coding apparatus, the coding method, and the program storage medium of the present invention, the relationship between first coded data and second coded data is determined, the first coded data and the second coded data are concatenated as one coded data in such a manner as to correspond to the determination result, and the one concatenated coded data is decoded with a predetermined number of codes being treated as units. Thus, it is possible to decode coded data without striking viewers and listeners as being incongruous.

Many different embodiments of the present invention may be constructed without departing from the spirit and scope of the present invention. It should be understood that the present invention is not limited to the specific embodiment described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An apparatus comprising:
a display configured to display titles of a plurality of content data in a package;
a user interface configured to receive a selection of one of the content data; and
circuitry configured to:
determine a relationship between the content data and a next content data, and
playback the content data and the next content data sequentially so that there is no soundless time period between the playbacks of the content data and the next content data according to the relationship,
wherein an information of the package does not include information to remove the soundless time period,
wherein the circuitry is configured to determine the relationship by determining if the content data and the next content data are sequential musical pieces, and
wherein the circuitry determines if the content data and the next content data are sequential musical pieces by determining if numbers corresponding to the content data and the next content data are in sequence.

2. An apparatus comprising:
a display configured to display titles of a plurality of content data in a package;
a user interface configured to receive a selection of one of the content data; and
circuitry configured to:
determine a relationship between the content data and a next content data, and
playback the content data and the next content data sequentially so that there is no soundless time period between the playbacks of the content data and the next content data according to the relationship,
wherein an information of the package does not include information to remove the soundless time period,
wherein the circuitry is configured to determine the relationship by determining if the content data and the next content data are sequential musical pieces, and
wherein the circuitry determines if the content data and the next content data are sequential musical pieces by determining if coded data of the content data and coded data of the next content data are sequential.

3. An apparatus comprising:
a display configured to display titles of a plurality of content data in a package;
a user interface configured to receive a selection of one of the content data; and
circuitry configured to:
determine a relationship between the content data and a next content data, and
playback the content data and the next content data sequentially so that there is no soundless time period between the playbacks of the content data and the next content data according to the relationship,
wherein an information of the package does not include information to remove the soundless time period,
wherein the circuitry is configured to determine the relationship by determining if the content data and the next content data are sequential musical pieces,
wherein the circuitry determines if the content data and the next content data are sequential musical pieces by determining if coded data of the content data and coded data of the next content data are sequential, and
wherein the circuitry deletes a header from the coded data of the next content data when the circuitry determines the coded data of the content data and the coded data of the next content data are sequential.

4. An apparatus comprising:
a display configured to display titles of a plurality of content data in a package;
a user interface configured to receive a selection of one of the content data; and
circuitry configured to:
determine a relationship between the content data and a next content data, and
playback the content data and the next content data sequentially so that there is no soundless time period between the playbacks of the content data and the next content data according to the relationship,
wherein an information of the package does not include information to remove the soundless time period,
wherein the circuitry is configured to determine the relationship by determining if the content data and the next content data are sequential musical pieces, and
wherein the circuitry determines if the content data and the next content data are sequential musical pieces based on data stored in a header of the content data or a header of the next content data.

5. An apparatus comprising:
a display configured to display titles of a plurality of content data in a package;
a user interface configured to receive a selection of one of the content data; and
circuitry configured to:
determine a relationship between the content data and a next content data, and
playback the content data and the next content data sequentially so that there is no soundless time period between the playbacks of the content data and the next content data according to the relationship,
wherein an information of the package does not include information to remove the soundless time period, and
wherein the circuitry playbacks the content data and the next content data sequentially by overlapping a first portion of decoded orthogonal transform block of the content data and a second portion of decoded orthogonal transform block of the next content data.

6. An apparatus comprising:
a display configured to display titles of a plurality of content data in a package;
a user interface configured to receive a selection of one of the content data; and
circuitry configured to:
 determine a relationship between the content data and a next content data, and
 payback the content data and the next content data sequentially so that there is no soundless time period between the playbacks of the content data and the next content data according to the relationship,
wherein an information of the package does not include information to remove the soundless time period,
wherein the circuitry playbacks the content data and the next content data sequentially by overlapping a first portion of decoded orthogonal transform block of the content data and a second portion of decoded orthogonal transform block of the next content data, and
wherein the circuitry overlaps the first portion and the second portion by adding a back portion of samples created by applying an IMDCT (Inverse Modified Discrete Cosine Transform) on a sound unit of the content data and a forward portion of samples created by applying the IMDCT (Inverse Modified Discrete Cosine Transform) on a sound unit of the next content data.

7. A method, implemented on an apparatus, comprising:
displaying, by a display, titles of a plurality of content data in a package;
receiving, at a user interface, a selection of one of the content data;
determining a relationship between the content data and a next content data, and
playing back, by circuitry, the content data and the next content data sequentially so that there is no soundless time period between the playbacks of the content data and the next content data according to the relationship,
wherein an information of the package does not include information to remove the soundless time period,
wherein the determining the relationship is conducted by determining if the content data and the next content data are sequential musical pieces, and
wherein the determining if the content data and the next content data are sequential musical pieces is conducted by determining if numbers corresponding to the content data and the next content data are in sequence.

8. A method, implemented on an apparatus, comprising:
displaying, by a display, titles of a plurality of content data in a package;
receiving, at a user interface, a selection of one of the content data;
determining a relationship between the content data and a next content data, and
playing back, by circuitry, the content data and the next content data sequentially so that there is no soundless time period between the playbacks of the content data and the next content data according to the relationship,
wherein an information of the package does not include information to remove the soundless time period,
wherein the determining the relationship is conducted by determining if the content data and the next content data are sequential musical pieces, and
wherein the determining if the content data and the next content data are sequential musical pieces is conducted by determining if coded data of the content data and coded data of the next content data are sequential.

9. A method, implemented on an apparatus, comprising:
displaying, by a display, titles of a plurality of content data in a package;
receiving, at a user interface, a selection of one of the content data;
determining a relationship between the content data and a next content data, and
playing back, by circuitry, the content data and the next content data sequentially so that there is no soundless time period between the playbacks of the content data and the next content data according to the relationship,
wherein an information of the package does not include information to remove the soundless time period,
wherein the determining the relationship is conducted by determining if the content data and the next content data are sequential musical pieces,
wherein the determining if the content data and the next content data are sequential musical pieces is conducted by determining if coded data of the content data and coded data of the next content data are sequential, and
wherein the method further comprises deleting a header from the coded data of the next content data when the coded data of the content data and the coded data of the next content data are determined to be sequential.

10. A method, implemented on an apparatus, comprising:
displaying, by a display, titles of a plurality of content data in a package;
receiving, at a user interface, a selection of one of the content data;
determining a relationship between the content data and a next content data, and
playing back, by circuitry, the content data and the next content data sequentially so that there is no soundless time period between the playbacks of the content data and the next content data according to the relationship,
wherein an information of the package does not include information to remove the soundless time period,
wherein the determining the relationship is conducted by determining if the content data and the next content data are sequential musical pieces, and
wherein the determining if the content data and the next content data are sequential musical pieces is conducted based on data stored in a header of the content data or a header of the next content data.

11. A method, implemented on an apparatus, comprising:
displaying, by a display, titles of a plurality of content data in a package;
receiving, at a user interface, a selection of one of the content data;
determining a relationship between the content data and a next content data, and
playing back, by circuitry, the content data and the next content data sequentially so that there is no soundless time period between the playbacks of the content data and the next content data according to the relationship,
wherein an information of the package does not include information to remove the soundless time period, and
wherein the playing back is conducted by overlapping a first portion of decoded orthogonal transform block of the content data and a second portion of decoded orthogonal transform block of the next content data.

12. A method, implemented on an apparatus, comprising:
displaying, by a display, titles of a plurality of content data in a package;
receiving, at a user interface, a selection of one of the content data;

determining a relationship between the content data and a next content data, and playing back, by circuitry, the content data and the next content data sequentially so that there is no soundless time period between the playbacks of the content data and the next content data according to the relationship, wherein an information of the package does not include information to remove the soundless time period, wherein the playing back is conducted by overlapping a first portion of decoded orthogonal transform block of the content data and a second portion of decoded orthogonal transform block of the next content data, and wherein the overlapping is conducted by adding a back portion of samples created by applying an IMDCT (Inverse Modified Discrete Cosine Transform) on a sound unit of the content data and a forward portion of samples created by applying the IMDCT (Inverse Modified Discrete Cosine Transform) on a sound unit of the next content data.

13. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, wherein the determining the relationship is conducted by determining if the content data and the next content data are sequential musical pieces, and wherein the determining if the content data and the next content data are sequential musical pieces is conducted by determining if numbers corresponding to the content data and the next content data are in sequence.

14. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, wherein the determining the relationship is conducted by determining if the content data and the next content data are sequential musical pieces, and wherein the determining if the content data and the next content data are sequential musical pieces is conducted by determining if coded data of the content data and coded data of the next content data are sequential.

15. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, wherein the determining the relationship is conducted by determining if the content data and the next content data are sequential musical pieces, wherein the determining if the content data and the next content data are sequential musical pieces is conducted by determining if coded data of the content data and coded data of the next content data are sequential, and wherein the method further comprises deleting a header from the coded data of the next content data when the coded data of the content data and the coded data of the next content data are determined to be sequential.

16. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, wherein the determining the relationship is conducted by determining if the content data and the next content data are sequential musical pieces, and wherein the determining if the content data and the next content data are sequential musical pieces is conducted based on data stored in a header of the content data or a header of the next content data.

17. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, and wherein the playing back is conducted by overlapping a first portion of decoded orthogonal transform block of the content data and a second portion of decoded orthogonal transform block of the next content data.

18. A non-transitory computer readable medium that stores a program which when executed by a computer, causes the computer to perform a method comprising:

displaying, by a display, titles of a plurality of content data in a package;

receiving, at a user interface, a selection of one of the content data;

determining a relationship between the content data and a next content data, and playing back the content data and the next content data sequentially so that there is no soundless time period between the playbacks of the content data and the next content data according to the relationship, wherein an information of the package does not include information to remove the soundless time period, wherein the playing back is conducted by overlapping a first portion of decoded orthogonal transform block of the content data and a second portion of decoded orthogonal transform block of the next content data, and wherein the overlapping is conducted by adding a back portion of samples created by applying an IMDCT (Inverse Modified Discrete Cosine Transform) on a sound unit of the content data and a forward portion of samples created by applying the IMDCT (Inverse Modified Discrete Cosine Transform) on a sound unit of the next content data.

19. The apparatus according to either one of the claims 1-6, wherein the content data is data recorded on a disk.

20. The method according to either one of the claims 7-12, wherein the content data is data recorded on a disk.

21. The non-transitory computer readable medium according to either one of the claims 13-18, wherein the content data is data recorded on a disk.

* * * * *